United States Patent [19]

Shimada et al.

[11] Patent Number: 5,084,895
[45] Date of Patent: Jan. 28, 1992

[54] SEMICONDUCTOR LIGHT EMITTING SYSTEM

[75] Inventors: Junichi Shimada; Renshi Sawada, both of Saitama, Japan

[73] Assignee: Nippon Telegraph Telephone Corporation, Tokyo, Japan

[21] Appl. No.: 483,853

[22] Filed: Feb. 23, 1990

[30] Foreign Application Priority Data

Feb. 24, 1989 [JP] Japan ................. 1-44382

[51] Int. Cl.$^5$ .............................. H01S 3/19
[52] U.S. Cl. .............................. 372/50; 357/17; 372/108
[58] Field of Search .......... 372/108, 50; 357/17

[56] References Cited

U.S. PATENT DOCUMENTS 4,780,879 10/1988 Chinone et al. ............... 372/29

FOREIGN PATENT DOCUMENTS 0088885 5/1984 Japan ................. 372/108
62-107304 5/1986 Japan .
62-187320 8/1987 Japan .
62-275332 11/1987 Japan .

*Primary Examiner*—James W. Davie
*Attorney, Agent, or Firm*—Armstrong, Nikaido, Marmelstein, Kubovcik & Murray

[57] ABSTRACT

A semiconductor light emitting element, a laser or a light emitting diode which is deposited on a first area of a semiconductor substrate, which also carries a microlens for focusing or diverging an output beam of the light emitting element on a second area of the substrate. Both the light emitting element and the microlens are deposited on a substrate through a photolithoetching process, and an alignment of an optical axis of the light emitting element and an optical axis of the microlens is accomplished in the steps of producing a light emitting semiconductor system. Thus, a semiconductor light emitting system which functions not only to generate light but also to focus or diverge the light, and is small in size and light in weight, can be obtained.

15 Claims, 14 Drawing Sheets

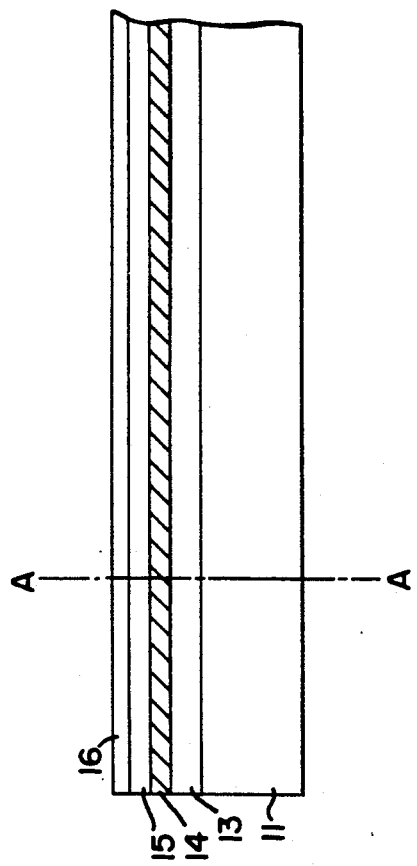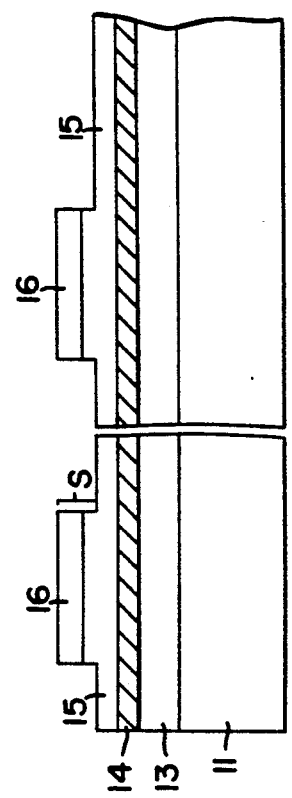
Fig. 10A
Fig. 10B

ETCHED MIRROR

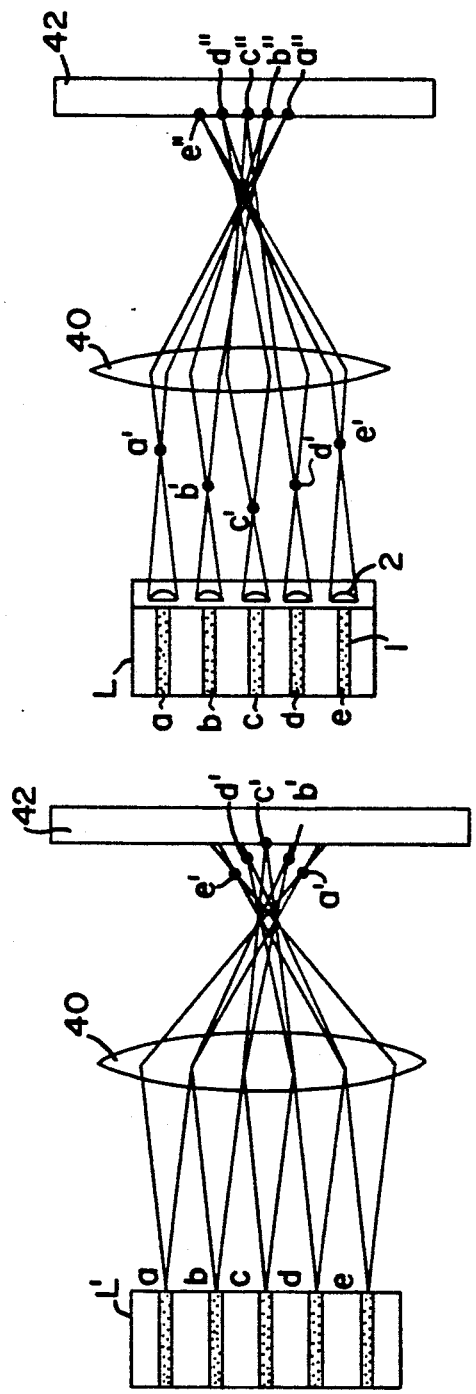

SEMICONDUCTOR LIGHT EMITTING SYSTEM

BACKGROUND OF THE INVENTION

The present invention relates to a semiconductor light emitting system, and in particular, relates to a system having a semiconductor light emitting element like a laser or a light emitting diode, and a microlens integrated with said light emitting element on a common semiconductor substrate.

Conventionally, light emitted by a semiconductor laser is focused by using a microlens which is located separately from the laser as shown in the Japanese patent laid open publication 187320/87.

However, that prior art has the disadvantages that it is difficult to locate a lens so that an optical axis of a laser coincides with that of a lens, since the lens is separated from the laser, and that the total size of the system including the laser and the lens is rather large, since the microlens has some size and weight.

Another prior art reference teaches the combination of a semiconductor laser and a waveguide lens. However, this prior waveguide lens has the disadvantages that a small spot less than several microns is impossible to form since an NA value (numerical aperture) higher than 0.2 with an efficiency higher than 10% cannot be formed therein, and that a beam is focused only in a lateral direction, but is not focused in a vertical direction. In the vertical direction, the beam is not focused, but is even diffracted, because of the small size of the waveguide in the vertical direction.

SUMMARY OF THE INVENTION

It is an object, therefore, of the present invention to overcome the disadvantages and limitations of prior semiconductor light emitting systems by providing a new and improved light emitting system.

It is also an object of the present invention to provide a semiconductor light emitting system in which alignment of optical axes of a light source and a lens is relatively easy, and the system is small in size and light in weight.

The above and other objects are attained by a semiconductor light emitting system comprising a semiconductor substrate having a first area and a second area on a main plane which is parallel to XY plane and perpendicular to Z-direction; a semiconductor light emitting element deposited on said first area of said semiconductor substrate, having laminated semiconductor body including an active layer, clad layers sandwiching said active layer, and an output plane perpendicular to said laminated semiconductor body for emitting light beam; a microlens made of transparent material for said light beam deposited on second area of said semiconductor substrate; said microlens having at least a first plane facing to said output plane and a second plane for emitting light beam which is applied to said first plane; a gap space provided between said output plane of the light emitting element and said first plane of said microlens; said first plane and said second plane being essentially perpendicular to said main plane; a pair of electrode layers attached on said semiconductor substrate and said semiconductor laser, respectively, for energizing said semiconductor laser.

BRIEF DESCRIPTION OF THE DRAWINGS

The foregoing and other objects, features and attendant advantages of the present invention will be appreciated as the same become better understood by means of the following description and accompanying drawings wherein:

FIGS. 11A and 11B show the effect in practical use of the present invention (FIG. 11B) as compared with that of a prior art device (FIG. 11A).

DETAILED DESCRIPTION OF THE PREFERRED EMBODIMENT (Embodiment 1)

Figure 1:
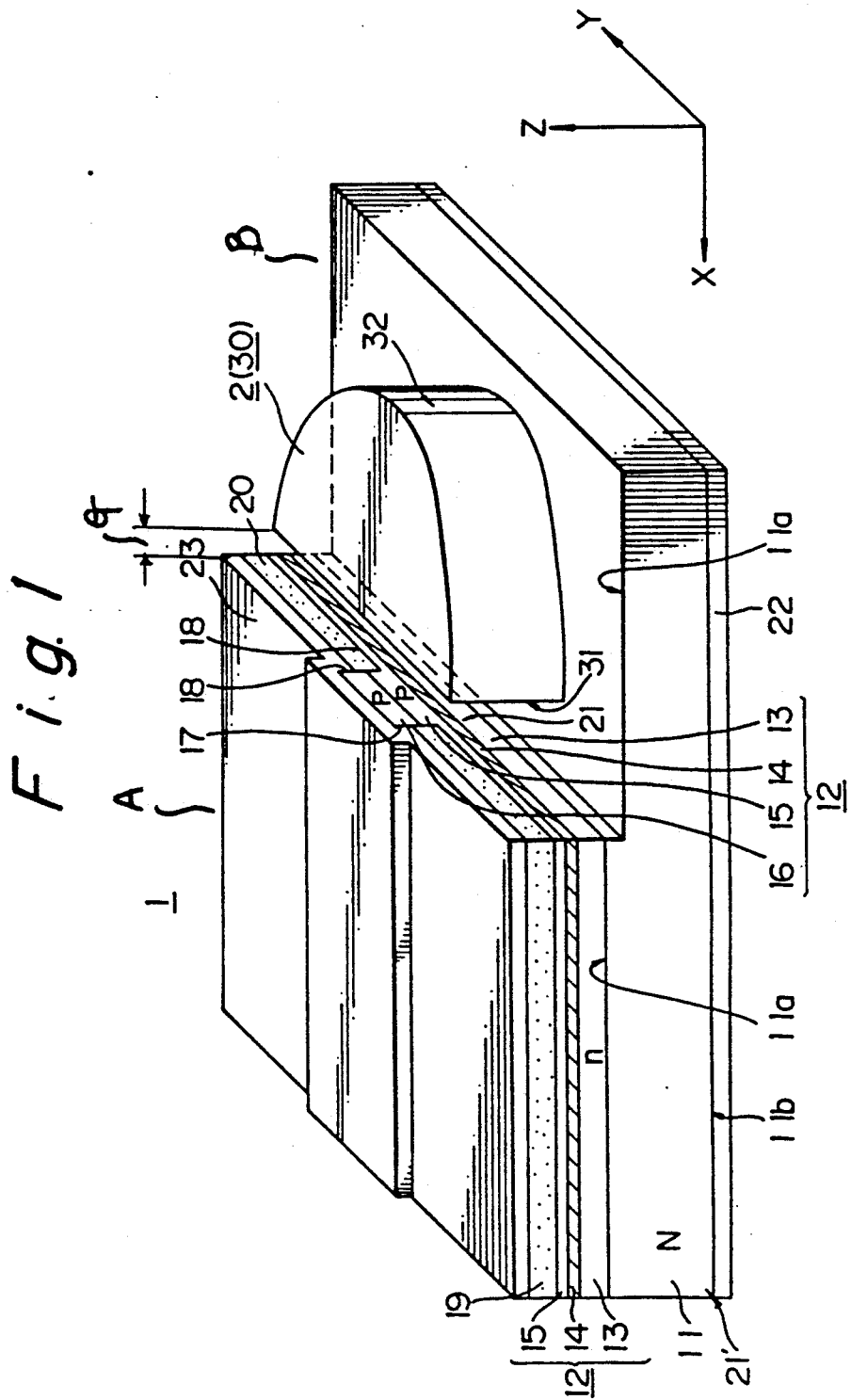
FIG. 1 shows the structure of the semiconductor light emitting system according to the present invention.

FIG. 1 shows the first embodiment of the semiconductor light emitting system according to the present invention.

In FIG. 1, the numeral 1 is a semiconductor laser, and the numeral 2 is a microlens. A semiconductor laser 1 itself is a conventional one, except it is deposited on a common semiconductor substrate 11 with a microlens 2.

The semiconductor substrate 11 is for instance of N-type GaAs having a main plane 11a on which both a semiconductor laminated body 12 and a microlens 2 are deposited.

The semiconductor laminated body 12 may be either a laser or a light emitting diode (LED). The following descriptions describe that it is a laser, but the scope of the invention is not limited to a laser.

A coordinate system XYZ is defined so that said main plane 11a is positioned on an XY plane, and a Z-axis is perpendicular to the XY plane. The semiconductor laminated body 12 and the microlens 2 are positioned on the common semiconductor substrate 11 along the X-axis.

The substrate 11 has a first area A on which a semiconductor laminated body 12 is deposited, and a second area B on which a lens 2 is deposited. The first area and the second area are located in the X-direction.

When the semiconductor element 12 is a laser, it comprises a clad layer 13 of N-type AlGaAs, an active layer 14 of I-type GaAs, another clad layer 15 of P-type AlGaAs, and a semiconductor layer 16 for attaching an electrode made of P-type GaAs laminated on the substrate 11 in sequence. Another electrode layer 22 is attached on the bottom surface of the substrate 11.

A pair of recesses 17 and 18 are provided on the semiconductor element 12 so that those recesses reach the clad layer 15 but do not reach the active layer 14, and the clad layer 15 has a mesa extending in the X-direction. Therefore, the electrode layer 16 on the mesa of the layer 15 is also shaped as an elongated stripe. The recesses 17 and 18 are filled with insulation layers 19 and 20 so that those layers reach the sides of the mesa of the clad layer 15. Those recesses (17 and 18) and the striped structure of the clad layer 15 are advantageous for diverging a light beam laterally in the Y-direction. A diverged light beam is preferable for focusing light by using a lens.

The semiconductor device 12 has a laser output plane 21 perpendicular to the main plane 11a, and an end plane 21' parallel to said output plane 21.

The electrode layer 22 is in ohmic contact with the bottom surface 11b of the substrate 11. Another electrode layer 23 is attached on the semiconductor element 12 in ohmic contact with the layer 16, and extending on the insulation layers 19 and 20.

A microlens 2 is positioned on the second area B of the main plane 11a of the substrate 11 so that the laser 1 and the lens 2 are aligned in the X-direction.

The microlens 2 is made of a layer 30 which is transparent to the laser light, and said layer 30 has a side surface 31 perpendicular to the main surface 11a for accepting the laser beam from the output plane 21, and another side surface 32 for outputting the light applied to the lens through said side surface 31.

The transparent material of the layer 30 is for instance $S_iO_2$ or polyimide resin, or $S_i$—N—O, or some organic material.

The lens layer 30 is symmetrical along an optical axis of the laser which is parallel to the X-axis. The input surface 31 is parallel to the output surface 21 of the laser 1, and is perpendicular to the main surface 11a of the substrate 11.

A gap space G is provided between the output plane 21 of the laser 1 and the input surface 31 of the lens 2. The length of the gap space between the layers 21 and 31 is preferably in the range between 0.4 $\mu$m and 1.5 $\mu$m, and has a refractive index of essentially 1. The gap space may be filled with some material as far as it has a refractive index close to 1.

The presence of the gap space G is advantageous to diverge the output beam of the laser. The diverged beam is preferable to focus by using a lens.

The output surface 32 of the lens 2 is convex shaped so that the lens 2 is a convex lens.

An optical axis of the laser 1 and that of the lens 2 must coincide in both Y coordinate and Z coordinate. In that case, the main surface 11a may have a step at the border between the first area A and the second area B so that the lens 2 is located on the lower plane than that of the laser 1 for allowing an optical axis of the laser to coincide with the center of the lens in the Z-direction.

When a laser 1 is energized by a power source through the electrodes 22 and 23, the device 1 emits a light beam, which is output from the output plane 21, and is input to the input plane 31 of the lens 2. The lens 2 functions to converge or focus the beam in the Y-direction, since the lens 2 is a convex lens. Therefore, the semiconductor system of FIG. 1 can provide a convergent beam without using an external lens.

It should be noted that a gap space between the laser 1 and the lens 2 is useful for focusing a beam, since a beam is first diverged in the gap space, and then, converged in the lens. A divergent beam is preferable to converge or focus the same.

It should be also noted that an optical axis of the lens may easily be aligned with an optical axis of a laser by using masks in a conventional process for producing an integrated semiconductor circuit. Therefore, no specific process for aligning the optical axes is necessary.

Further, it should be noted that a microlens deposited on a semiconductor substrate is small in size as compared with a prior separated microlens. Therefore, a semiconductor system including a laser and a lens is small in size. And, when a plurality of lasers are mounted in a matrix manner, each beam may be focused by using the specific lens for each beam. In a prior art, a lens is common to a plurality of beams, and therefore, individual focusing for each beam is impossible.

Further, it should be noted that the thickness of the lens 2 in the Z-direction is large enough for preventing diffraction in the Z-direction. Therefore, an output beam does not diverge in the Z-direction by diffraction. It should be appreciated that the thickness of the lens 2 is almost equal to the whole thickness of the laser including the layers 13, 14, 15, 19, and 23. If output laser beam goes through a thin waveguide, a beam would be diffracted at the output of the waveguide.

When the semiconductor laminated body 12 is a light emitting diode (LED), the thickness of the active layer 14 is larger than that of the laser. The thickness of an active layer of a light emitting diode is for instance 0.5 $\mu$m, and the thickness of an active layer of a laser is 0.1 $\mu$m. Further, a light emitting diode has a no-reflection coating layer on an output plane 21 and a rear plane 21', while a laser has no such a layer.

Now, the producing process of the present semiconductor light emitting system is described in accordance with FIG. 10.

First, the structure of FIG. 10(A) is produced through conventional steps. The N-type semiconductor substrate 11 is first prepared, and the N-type clad layer 13 is deposited on said substrate 11. Then, the I-type (intrinsic) active layer 14 is deposited on said clad layer 13. Then, the P-type clad layer 15 is deposited on said active layer 14. Then, the conductive ohmic contact electrode layer 16 is deposited on the clad layer 15. Thus, the structure of FIG. 10(A) is obtained. Alternatively, that structure of FIG. 10(A) is available commercially in a market.

Figure 10C:
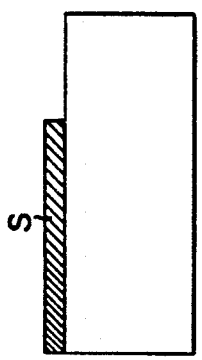
Figure 10D:
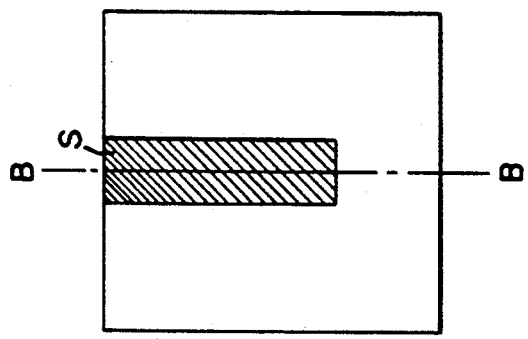
Figure 10E:
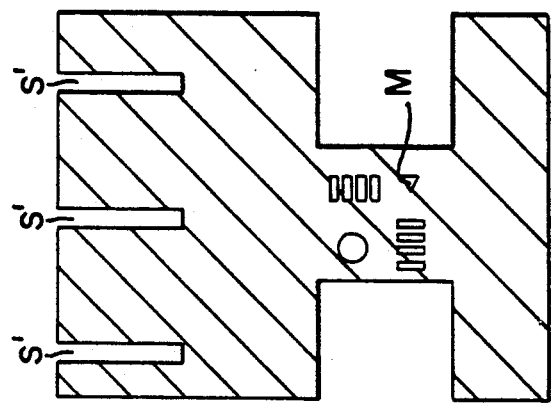

Next, the stripe structure is produced as shown in FIG. 10(B), which shows the cross section along the line A—A of FIG. 10(A). The stripe step removes partially the ohmic contact electrode layer 16 and a part of the clad layer 15, by providing a recess 17, 18 (FIG. 1), so that the remaining portion functions as a laser. In this step, a photoresist is first deposited on the whole surface of the layer 16. Then, the mask of FIG. 10E covers the structure. In FIG. 10E, the shadowed portion is transparent, and the elongated portion S' which corresponds to a stripe and the mark M is opaque. Then, the structure is illuminated with ultraviolet beam through mask of FIG. 10E. Thus, the structure is illuminated by the beam except of the opaque portions. Next, the structure is developed so that the illuminated portion of the photoresist is removed. Then, ion beam of chloride (Cl$_2$) illuminates the structure so that the portion not covered with the photoresist is grooved. The depth of the groove is that it reaches the clad layer 15, but does not reach the active layer 14. Finally, the photoresist which remains is removed. FIG. 10D is a plane view after the stripe step, and FIG. 10C is the cross section of FIG. 10D. The mask of FIG. 10E has a plurality of stripe patterns S' so that a plurality of stripes S are produced simultaneously. It should be noted that the mask has a marker M for positioning other mark. It should be noted that the pattern of the marker M is printed on the semiconductor structure in the above step.

Figure 10H:
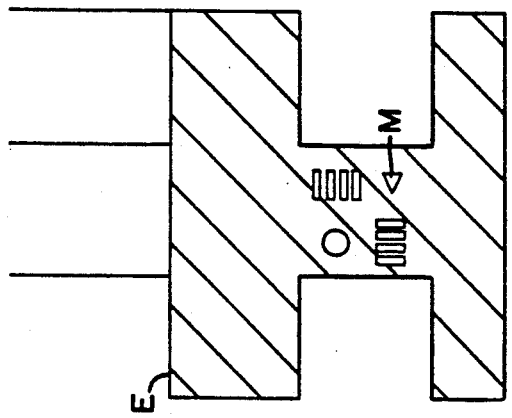
Figure 10G:
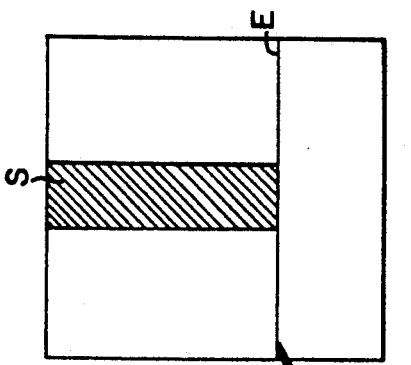
Figure 10F:
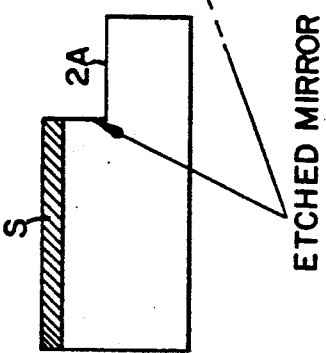

Next, an etched mirror and the step between the first area where a laser is located and a second area where a lens is located are produced. An etched mirror step provides the smooth surface of the output plane 21 (FIG. 1) of a laser. In that step, the mask of FIG. 10H is used so that the line E coincides with the etched mirror line E of FIG. 10G or the output plane 21. The positioning of the mask of FIG. 10H is carrid out merely by coinciding the marker M of FIG. 10H with that of FIG. 10E, which is printed on the semiconductor structure in the previous step. The positioning of a mask is accomplished by coinciding a marker M of a mask on a printed marker in the previous step in a microscope screen. The hatched portion of the mask is transparent, and another portion of the mask is opaque. The photoresist is first provided on the surface of the structure. The structure is illuminated by ultraviolet beam through the mask of FIG. 10H. Next, the structure is developed so that the photoresist on the non-illuminated portion is removed. Then, chloride ion takes out the structure where no photoresist exists. Therefore, the edge of the laser becomes smooth, and the substrate 11 has a step which defines the first area where a laser is located, and a second area where a lens is located. Finally, the photoresist which remains is removed. The numeral 2A in FIG. 10F shows the step down portion of the second area of the substrate 11.

Finally, the insulation layers are deposited in the recessed portion between the stripes, and the electrodes layers 22 and 23 are deposited through a conventional manner.

Next, a lens 2 is produced on the second area on the substrate 11. This step is explained in accordance with FIG. 10I–10K.

Figure 10K:
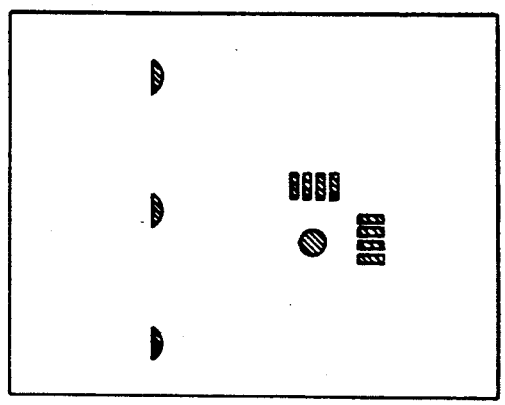
Figure 10J:
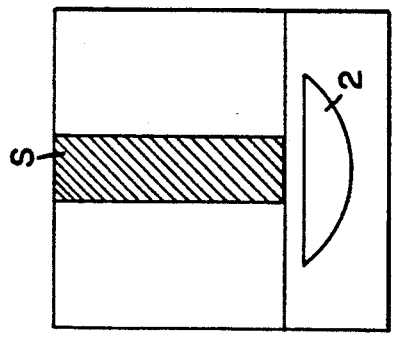
Figure 10I:
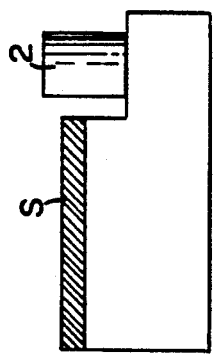

The mask for etching in this step is shown in FIG. 10K, in which the hatched portions are transparent, and other portions are opaque. The mask of FIG. 10K has the same marker M as that of other masks for the positioning of the mask. First, the material of a lens (S$_i$O$_2$, or S$_i$—N—O, or polyimide resin or some organic material) is deposited on the second area 2A so that the height of the deposited material is a little higher than that of the stripe S. Next, the whole structure is covered with photoresist. Next, the structure is illuminated by ultraviolet beam through the mask of FIG. 10K, so that only the lens portions are illuminated. Next, the photoresist on the lens portions is removed by developing. Next, Chromium ion (Cr) is sputtered on the structure through the mask so that the len portions are covered with Chromium layer. Next, the remaining photoresist (on non-lens portion) is removed. Next, the material of the lens at the portion where no lens exists is removed by ion sputtering of C$_3$F$_8$. A gap space between a lens and a laser is simultaneously produced in that step. Thus, the lens 2 is produced as shown in FIG. 10I and FIG. 10J. When the refractive index is controlled, the concetration of nitride (N) is adjusted during depositing S$_i$—N—O.

It should be appreciated in the above steps that the alignment of an optical axis of a laser (or a light emitting diode) and an optical axis of a lens is automatically accomplished during the photolithoetching steps by positioning markers of the masks.

Next, one of the particular effects of the present invention is described in accordance with FIGS. 11A and 11B. When a plurality of light emitting devices are arranged in an array with short intervals for illuminating multi-tracks of an optical storage medium simultaneously, a large common lens 40 is conventionally used for focusing all the beams (a) through (e) of the light emitting device L' as shown in FIG. 11A. However, because of the undesired aberration of the lens 40, all the beams can not focus simultaneously. If the beam c which passes the center portion of the lens 40 is focused at c' on the screen 42, other beams a, b, d, and e which pass through peripheral portions of the lens 40 focus at a', b', d' and e' which are not on the screen 42. Therefore, only one beam (a) can focus, but other beams are out of focus. That aberration is inevitable as far as a single common lens 40 is used for a plurality of beams.

On the other hand, according to the present invention, a light source array L which has a plurality of light emitting devices (a) through (e) has a plurality of lenses 2 for each light emitting devices. The lens 2 focuses at a', b', c', d' and e' for each beams (a) through (e), respectively, as shown in FIG. 11B so that the length to the point c' is shorter than the length to the point b' or d', and the length to the point b' or d' is shorter than the length to the point a' or e' as shown in FIG. 11B. When all the beams are input to the lens 40, all the beams focus at the points a", b", c", d" and e" which reside on the screen 42. That is to say, the aberration of the lens 40 is compensated by the difference of the focal length of each lenses of the lens assembly 2.

(Embodiment 2)

Figure 2:
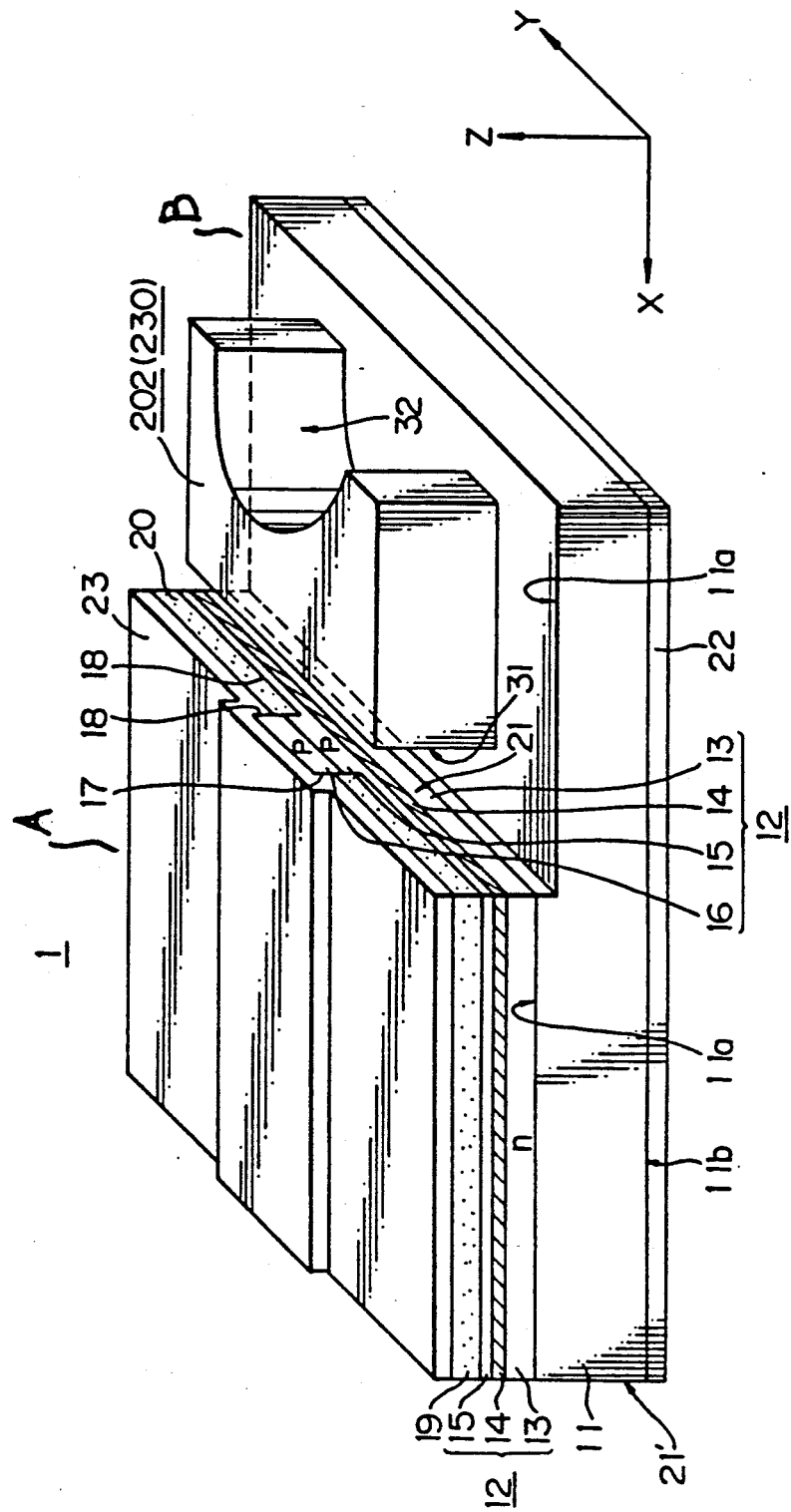
FIG. 2 shows another embodiment of the semiconductor light emitting system according to the present invention.

FIG. 2 shows the structure of another embodiment of a semiconductor light emitting system according to the present invention. The same numerals in FIG. 2 show the same members as those in FIG. 1.

The feature of FIG. 2 as compared with FIG. 1 is the structure of a microlens 202 which has a transparent layer 230, substituting a microlens 2 in FIG. 1.

The output side surface 32 of the microlens 202 in FIG. 2 is concave as shown in FIG. 2, so that the microlens 202 functions as a concave lens in Y-direction, while the microlens 2 in FIG. 1 functions as a convex lens.

As the microlens 202 is a concave lens, light beam is diverged in the plane which is parallel to the main plane 11$a$ of the semiconductor substrate 11.

It should be appreciated that the microlens 202 has all the effects of those of the microlens 2 in FIG. 1, except that the microlens 202 is a concave lens. It is easy to align an optical axis of a microlens 202 with that of a light emitting element 1 in producing process. The microlens 202 is small in size and light in weight, as the microlens 2 in FIG. 1. Also, since the size of the microlens is larger than 50 $\mu$m in each direction, no diffraction of light beam occurs.

(Embodiment 3)

Figure 3:
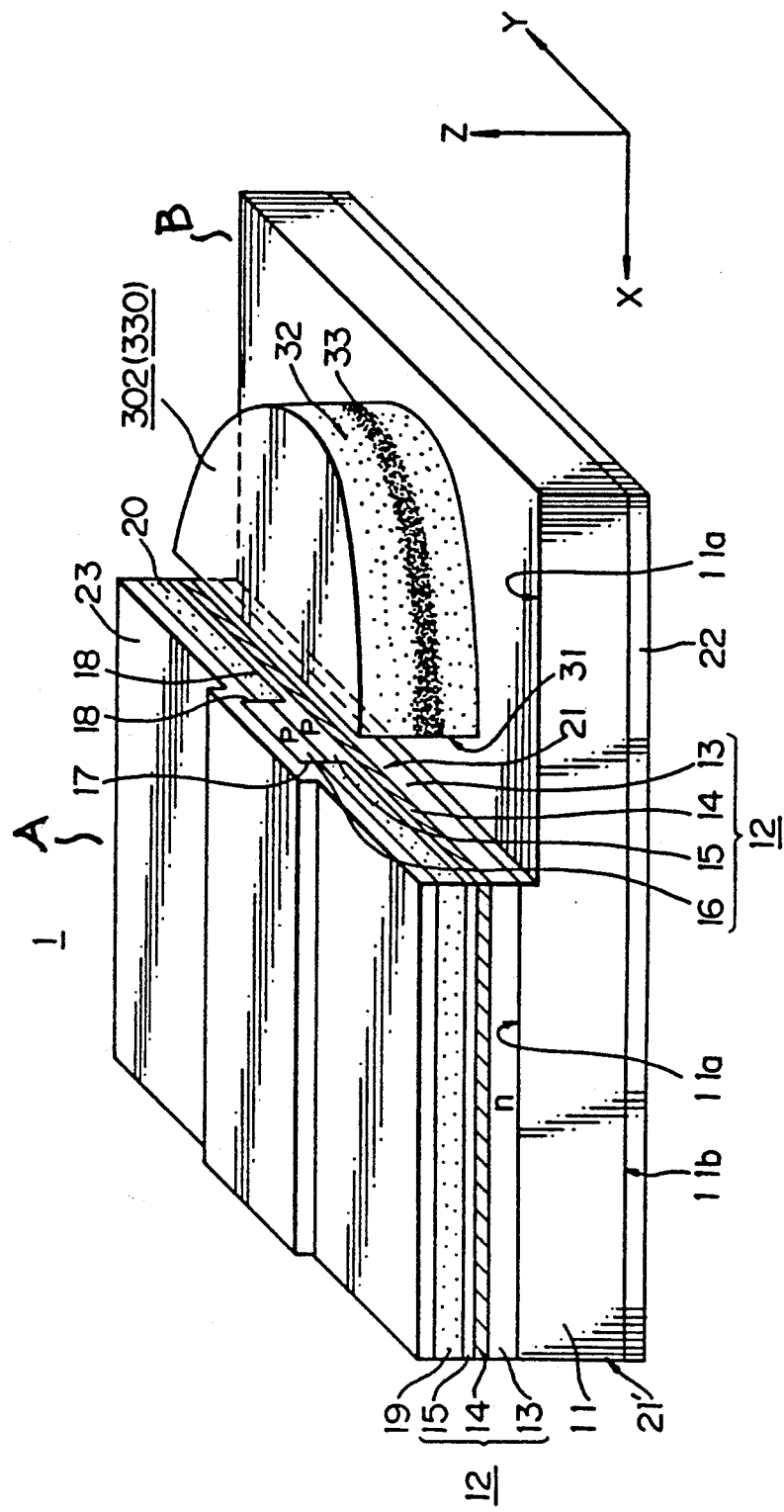
FIG. 3 shows still another embodiment of the semiconductor light emitting system according to the present invention.

FIG. 3 shows still another embodiment of a semiconductor light emitting system according to the present invention. The same numerals as those in FIG. 3 show the same members as those of FIG. 1. The feature of the embodiment of FIG. 3 is the presence of a microlens 302, instead of the microlens 2 in FIG. 1. The microlens 302 in FIG. 3 is composed of a transparent layer 330, which is in flat shap having a flat input plane 31 perpendicular to the main plane 11a of the semiconductor substrate 11, and a convex output plane perpendicular to said main plane 11a.

The important feature of the microlens 302 is the refraction index distribution of the layer 330 in Z-direction so that the refraction index at the center portion 33 in the Z-direction is higher than that of the end portions in the Z-direction. Preferably, the refractive index distribution in Z-direction is symmetrical.

The desired distribution of the refractive index in Z-direction (thickness direction) of a microlens is implemented by adjusting the ratio of nitrogen (N) when Si—N—O is deposited for producing the transparent layer 330 for the microlens 302 on the semiconductor substrate 11. The ratio of nitrogen is first small for the small refractive index, and that ratio is increased gradually for the larger refractive index. When the thickness of the layer 330 reaches half of the final thickness, the ratio of nitrogen is then decreased gradually for the smaller refractive index during the depositing step.

It should be appreciated that the microlens 302 in FIG. 3 can converge or focus a light beam not only in Y-direction, but also in the Z-direction because of the convex profile of the output plane 32 and the refractive index distribution as mentioned above, while the microlens 2 in FIG. 1 converges or focuses light beam in only Y-direction.

It should be appreciated that the microlens 302 in FIG. 3 has all the effects of those of the microlens 2 in FIG. 1, except that the microlens 302 has the refractive index distribution. It is easy to align or coincide an optical axis of the microlens 302 to that of a light emitting element 1 in producing process. The microlens 302 is small in size, and light in weight, as is the case of the microlens 2 in FIG. 1. Also, since the size of the microlens 302 is larger than 50 μm in each direction, no diffraction of light beam occurs.

Further, it should be appreciated that the undesired astigmation of a semiconductor laser 1 is removed by designing properly the convex curve of the output plane 32 and the refractive index distribution. The astigmation is a kind of aberration in which the focal length in Y-direction differs from that in Z-direction.

(Embodiment 4)

Figure 4:
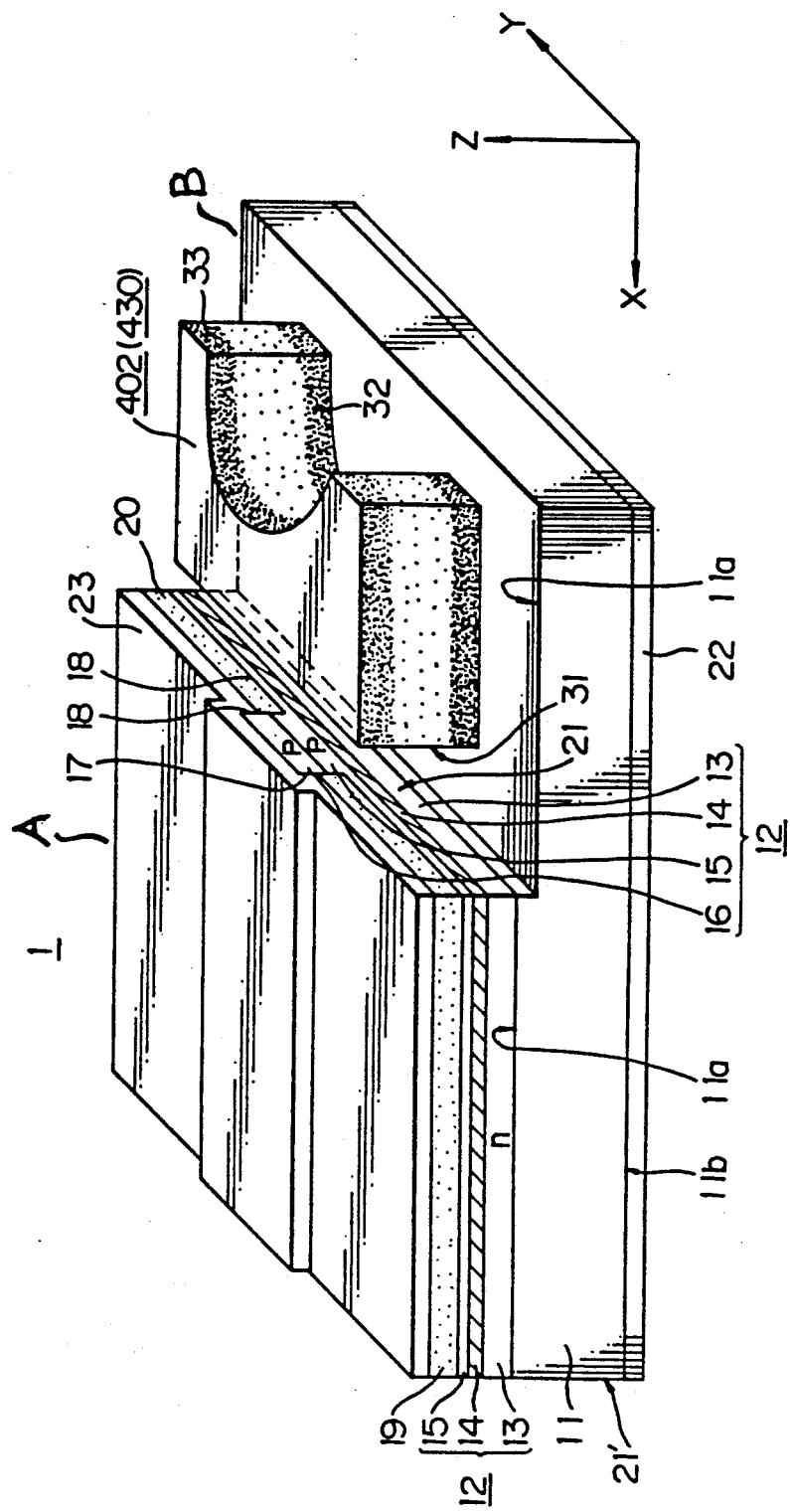
FIG. 4 shows still another embodiment of the semiconductor light emitting system according to the present invention.

FIG. 4 shows still another embodiment of a semiconductor light emitting system according to the present invention. The same numerals as those in FIG. 2 show the same members.

The feature of the embodiment of FIG. 4 as compared with the embodiment of FIG. 2 is the presence of the microlens 402 which is composed of the transparent layer 430.

The transparent layer 430 has the refractive index distribution that the refractive index at the center portion in the thickness direction (Z-direction) is the smallest, and increases gradually towards the ends of the layer 430. Preferably, the distribution is symmetrical to center plane in thickness direction (Z-direction) of the layer 430. That refractive index distribution is attained by adjusting the ratio of nitrogen (N) of Si—N—O which composes a transparent layer 430 so that the ratio of N is high at first in the depositing process, and that ratio is decreasing towards the center of the layer, and then, that ratio is increasing gradually towards the upper end of the layer 430. Accordingly, it should be noted that the microlens 402 functions as a concave lens in Z-direction. Since the lens 402 functions as a concave lens in Y-direction because of the recessed profile of the output plane 32, the microlens 402 operates as a concave lens in both the Y-direction and the Z-direction.

Therefore, a light beam is diverged in both the Y-direction and the Z-direction.

The embodiment of FIG. 4 has the similar effects to those of the embodiment of FIG. 2. It is easy to coincide an optical axis of a microlens 402 to that of a light emitting element 1 in producing process. The microlens 402 is small in size and light in weight. Also, since the size of the microlens is larger than 50 μm in each direction, no diffractoin of light beam occurs.

Further, the astigmatism of the beam is removed by designing properly the curve 32 and the refractive index distribution of the layer 430, as is the case of the embodiment of FIG. 3.

(Embodiment 5)

Figure 5:
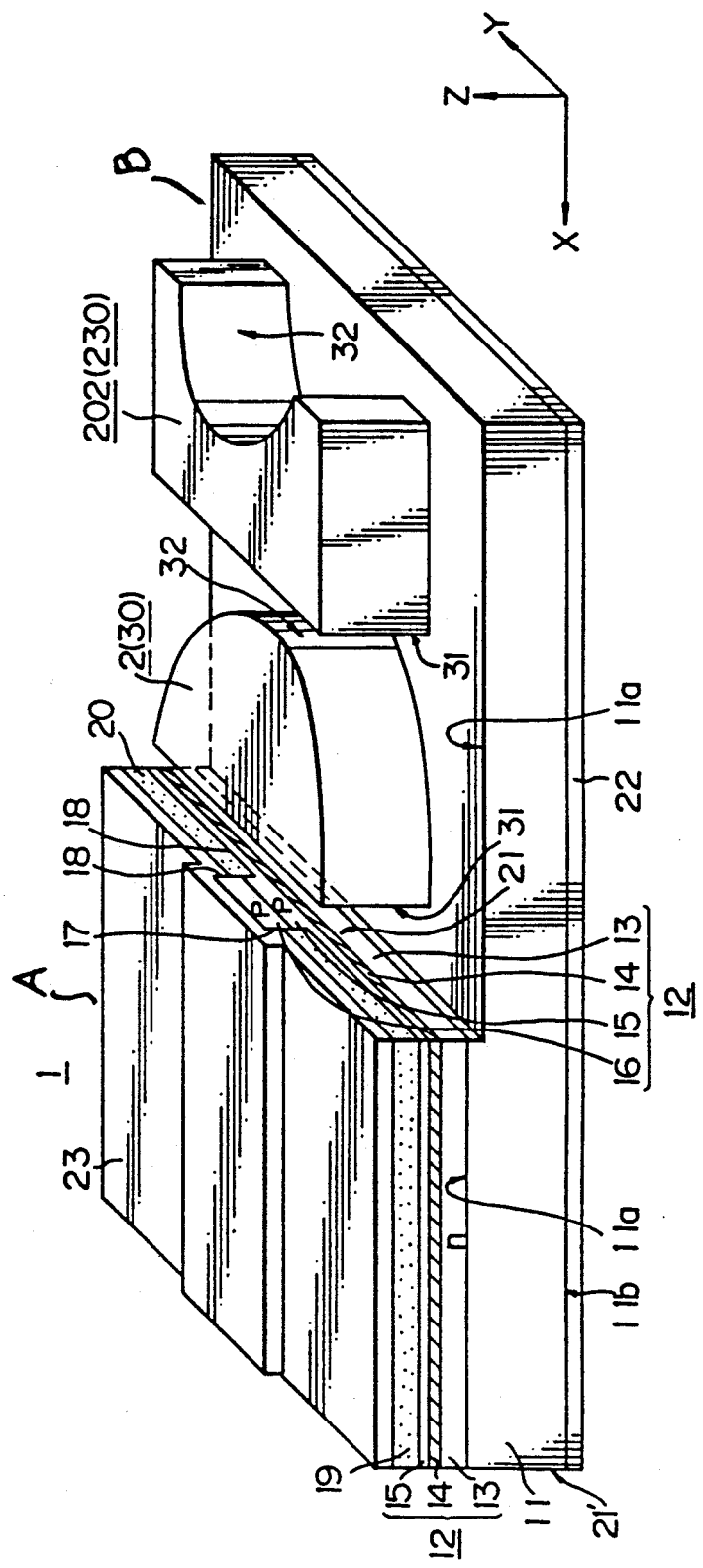
FIG. 5 shows still another embodiment of the semiconductor light emitting system according to the present invention.

FIG. 5 shows still another embodiment of the semiconductor light emitting system according to the present invention. The same numerals in FIG. 5 as those of FIGS. 1 and 2 show the same members.

The feature of the embodiment of FIG. 5 is that a first microlens 2 and a second microlens 202 are provided on the beam path. The microlens 2 in FIG. 5 is the same as that of FIG. 1, and the microlens 202 is the same as that of FIG. 2.

The embodiment of FIG. 5 provides a diverged beam, and the beam is more diverged as compared with that of FIG. 2, since the beam input to the concave lens 202 in FIG. 5 is first converged by the lens 2.

Similarly, when a concave lens is located first, and a convex lens is located at output of the concave lens, the focusing characteristics of an output beam is better than that of FIG. 1.

(Embodiment 6)

Figure 6:
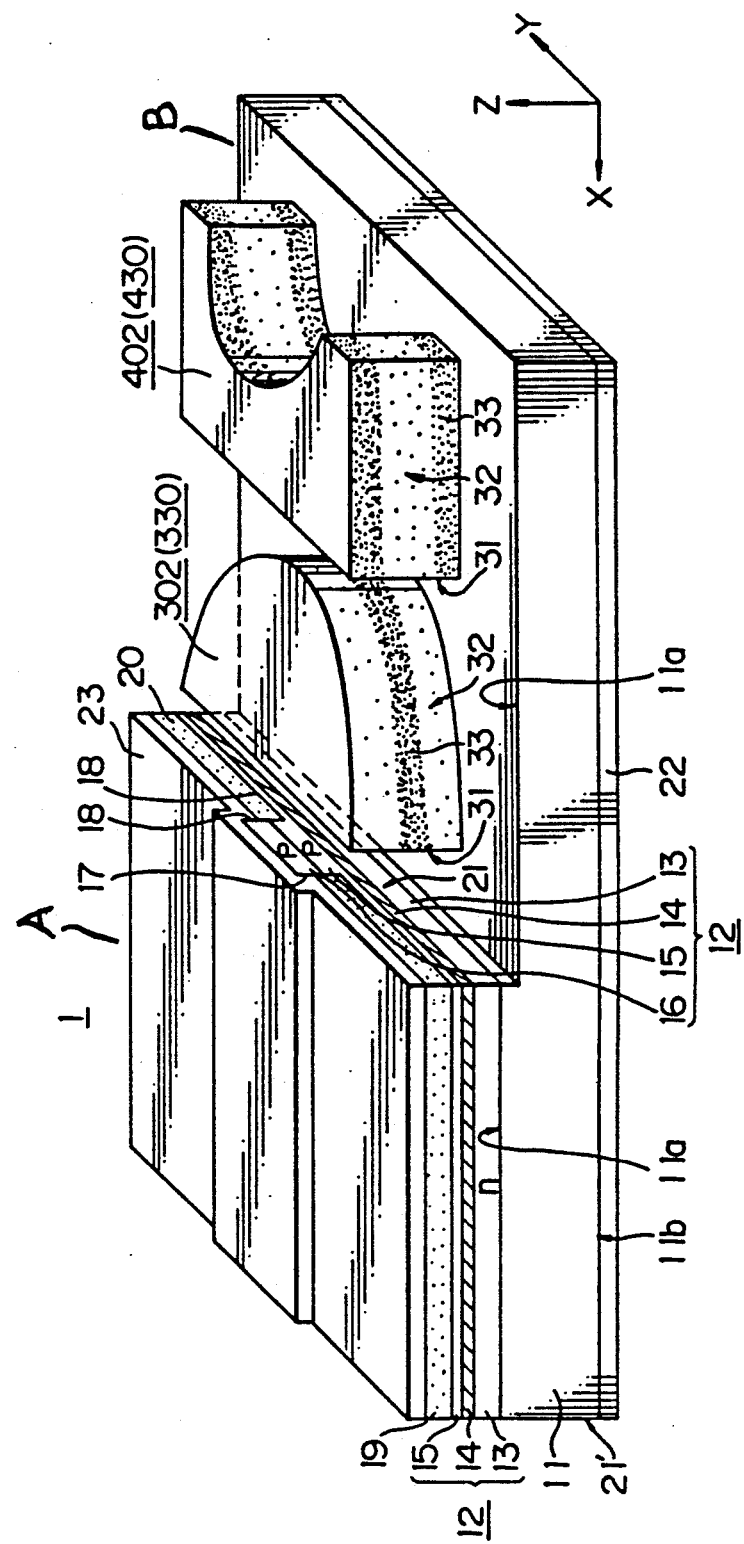
FIG. 6 shows still another embodiment of the semiconductor light emitting system according to the present invention.

FIG. 6 shows still another embodiment of the semiconductor light emitting system according to the present invention. The same numerals in FIG. 5 as those of FIGS. 3 and 4 show the same members.

The feature of the embodiment of FIG. 6 is that the lens 302 similar to the microlens in FIG. 3 and the lens 402 similar to the microlens in FIG. 4 are provided on the beam path.

The embodiment of FIG. 6 provides a diverged beam, and the beam is more diverged as compared with that of FIG. 4, by the same reason described in accordance with FIG. 5.

As a modification of FIG. 6, it is possible to locate a concave lens 402 first, and a convex lens 302 at the output of the concave lens 402. In that case, an excellent focused beam is obtained.

(Embodiment 7)

Figure 7:
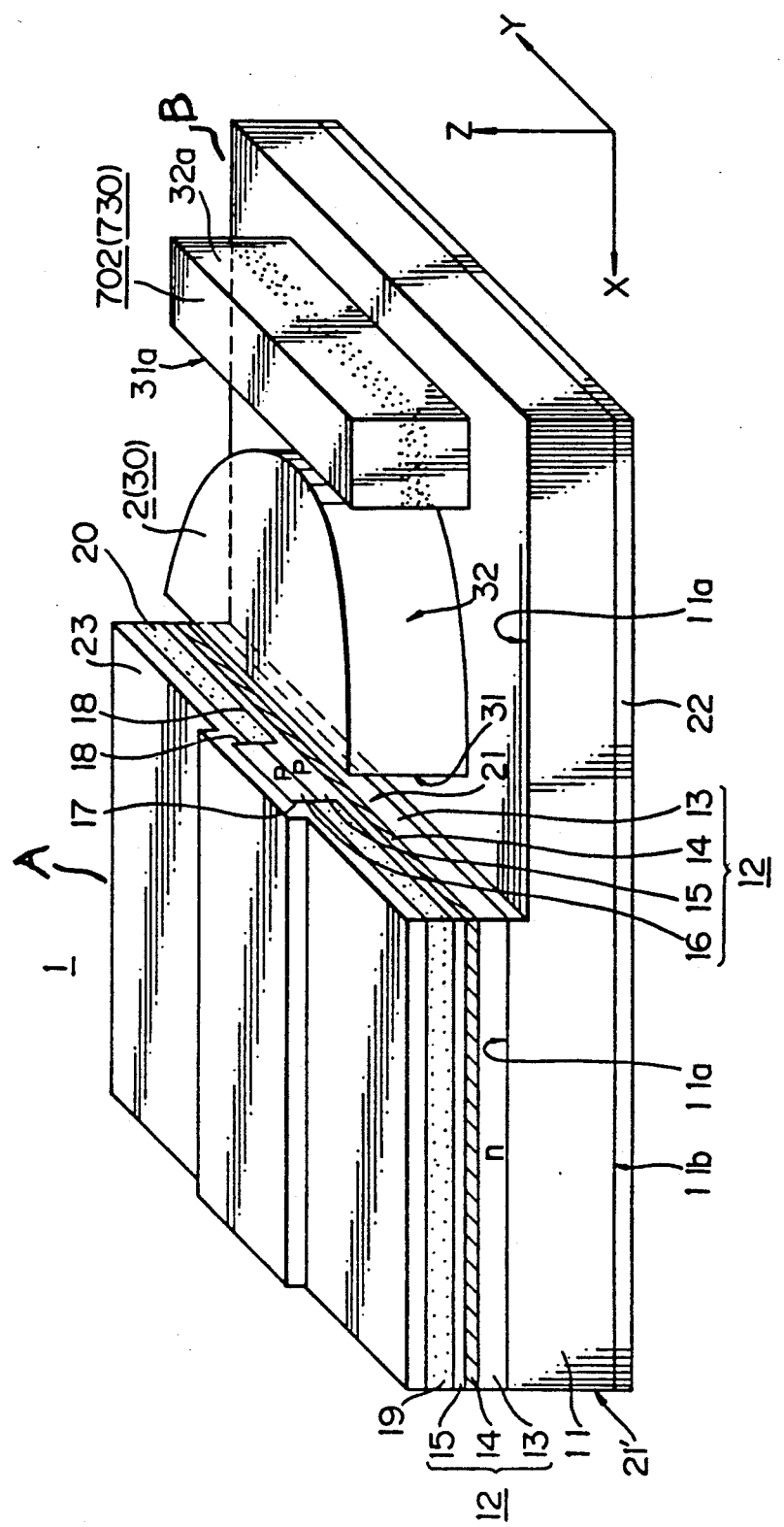
FIG. 7 shows still another embodiment of the semiconductor light emitting system according to the present invention.

FIG. 7 shows still another embodiment of the semiconductor light emitting system according to the present invention. The same numerals as those in FIGS. 1 and 3 show the same members.

The feature of the embodiment of FIG. 7 is the presence of the microlens 702 composed of the transparent layer 730.

The microlens 702 is in rectangular shape having an input plane 31a which is essentially parallel to the input plane 31 of the microlens 2, and an output plane 32a which is essentially parallel to the input plane 31a. The height or the thickness of the lens 702 is essentially the same as that of the lens 2. The refractive index of the lens 702 has the distribution in the Z-direction as is the case of the lens 302 in FIG. 3. That is to say, the refractive index at the center portion in thickness direction (Z-direction) of the lens 702 is higher than that of the end portions.

An output beam from the laser 1 is first converged in the Y-direction by the first lens 2, and then, focused in the Z-direction by the lens 702. Therefore, the beam is focussed in both the Y-direction and the Z-direction. The embodiment of FIG. 7 can design the Y-direction characteristics and the Z-direction characteristics of an output beam separately, by designing two lenses 2 and 702.

(Embodiment 8)

Figure 8:
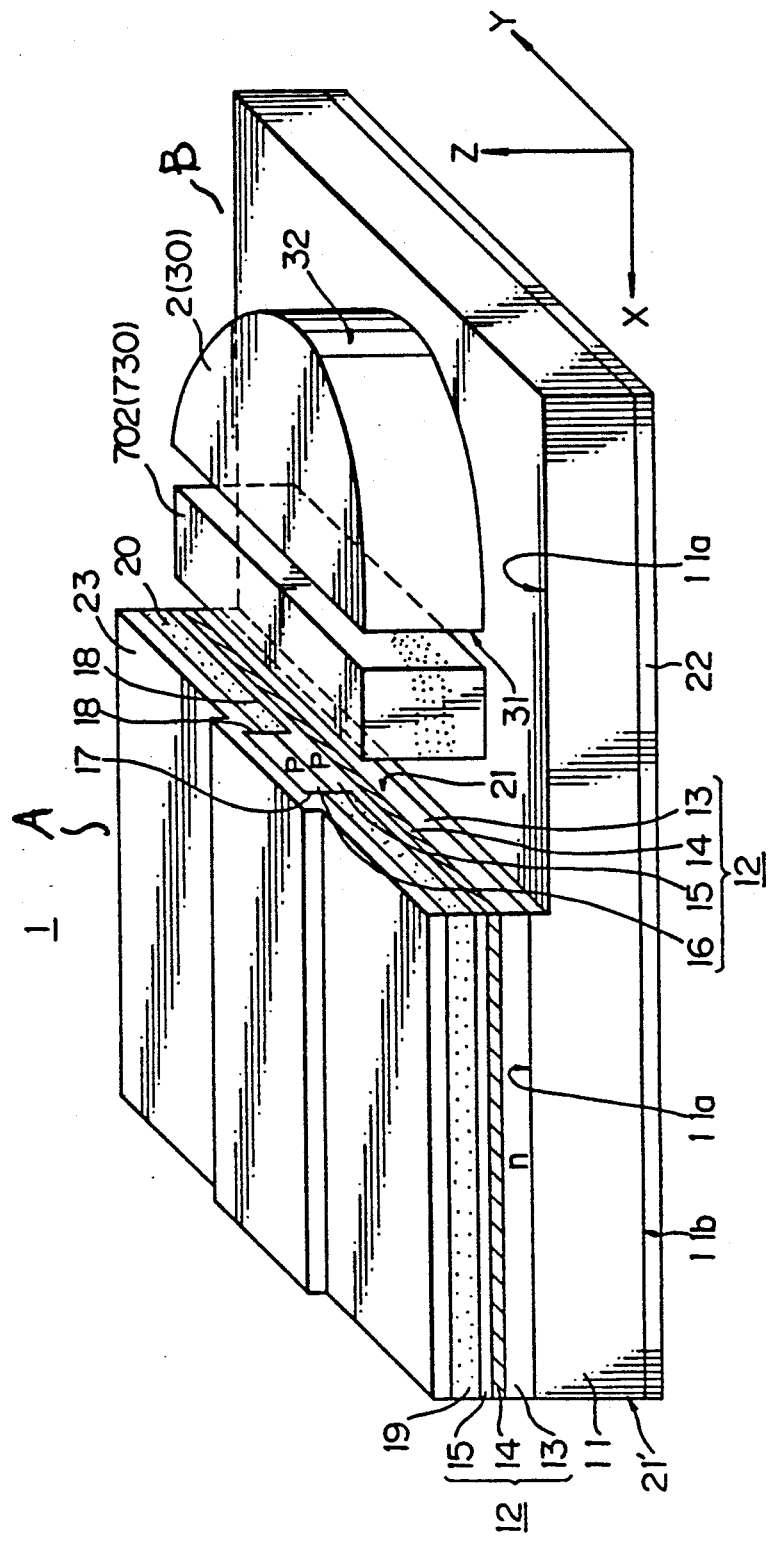
FIG. 8 shows still another embodiment of the semiconductor light emitting system according to the present invention.

FIG. 8 shows still another embodiment of the semiconductor light emitting system according to the present invention. The embodiment of FIG. 8 is the modification of FIG. 7, and the feature of FIG. 8 resides in the location of the lenses 2 and 702. The lens 2 which has the refractive index distribution in Z-direction is located first in the beam path, and the lens 2 which has the curved surface is located at the output of the lens 702. An output beam of the laser 1 is focused similar to that of the embodiment of FIG. 7.

Figure 9:
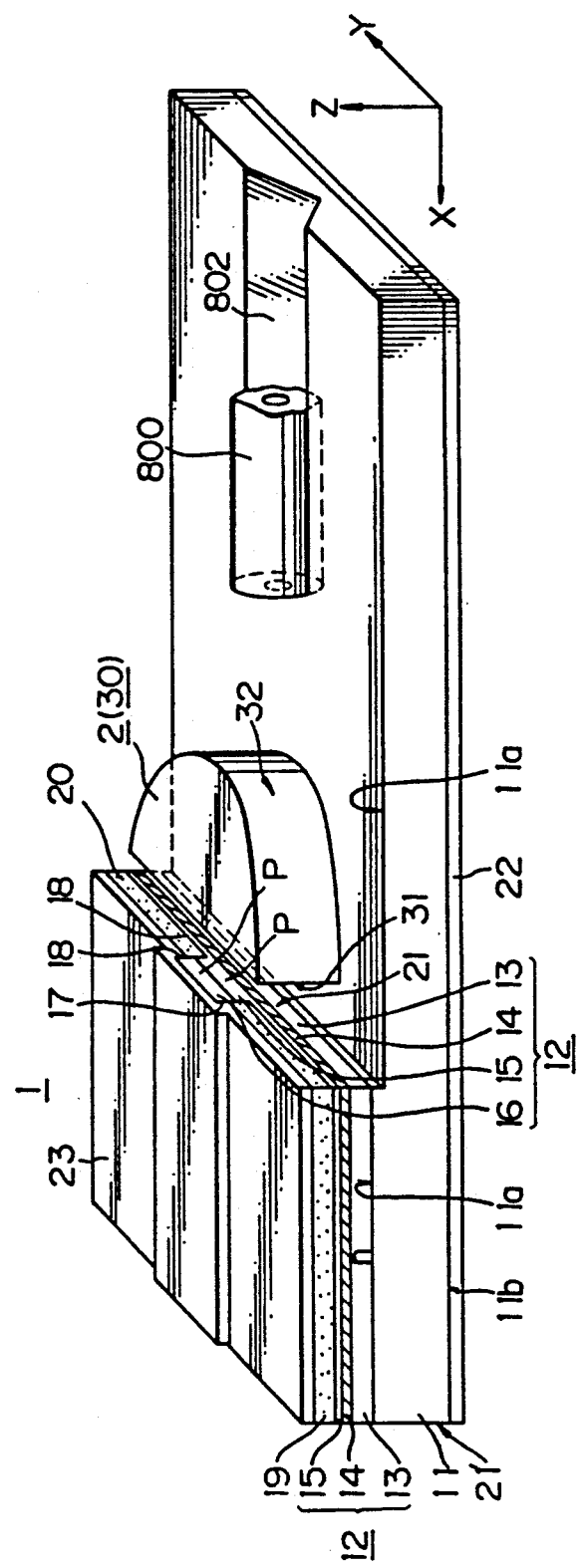
FIG. 9 shows an example of the practical use of the present semiconductor light emitting system, FIGS. 10A–10K schematically show the producing steps of the present semiconductor light emitting system.

FIG. 9 shows a practical structure of the semiconductor light emitting system according to the present invention. In FIG. 9, a groove 802 is provided on the semiconductor substrate 11, and an optical fiber 800 is located on said groove 802 so that an output beam from a microlens 2 is applied to the optical fiber 800. Preferably, the optical fiber 800 is located so that the optical axis of the fiber coincides with that of the lens 2. The groove 802 functions to fix the fiber 800 rigidly.

Some modifications are of course possible to those skilled in the art according to the disclosed embodiments. For instance a flat plane 31 of a lens may be concave or convex for providing a convex lens or a concave lens.

A producing method explained in accordance with FIGS. 10A–10K may be applicable to all the embodiments, and all the embodiments have the effect as described in accordance with FIG. 11B. A gap space with the refractive index essentially equal to 1 may be provided between two lenses in the embodiments of FIG. 5 through FIG. 8.

From the foregoing, it will now be apparent that a new and improved semiconductor light emitting system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A semiconductor light emitting system, comprising:
a semiconductor substrate having a first area and a second area, said second area having a main plane;
a semiconductor light emitting element disposed on said first area of said semiconductor substrate, said semiconductor light emitting element having a laminated semiconductor body which includes an active layer, a pair of clad layers sandwiching said active layer, and an output plane perpendicular to said main plane of said laminated semiconductor body for emitting a light beam;
a microlens spaced from said laminated semiconductor body and being disposed on said second area of said semiconductor substrate for focusing said light beam output from said output plane of said laminated semiconductor body, said microlens having a first surface which is substantially planar and which is substantially parallel to said output plane, said first surface of said microlens being spaced from said output plane of said laminated semiconductor body by a predetermined gap distance; said microlens being composed of transparent material;
said microlens having a second surface for emitting said light beam supplied to said first surface from said output plane;
said first surface and said second surface of said microlens being substantially perpendicular to said main plane of said laminated semiconductor body; and
a pair of electrode layers attached on said semiconductor substrate and said semiconductor light emitting element, respectively, for energizing said semiconductor light emitting element.

2. A semiconductor light emitting device according to claim 1, wherein said microlens is a convex lens having first and second lens planes, wherein said second lens plane is convex.

3. A semiconductor light emitting device according to claim 1, wherein said microlens is a concave lens having first and second lens planes, wherein said second plane is concave.

4. A semiconductor light emitting device according to claim 2, wherein said microlens has a varying refractive index which varies with respect to distance along a thickness direction extending perpendicularly from said main plane such that the refractive index of said microlens at a center portion thereof along said thickness direction is higher than that at either end portion of said microlens along said thickness direction.

5. A semiconductor light emitting device according to claim 3, wherein said microlens has a varying refractive index which varies with respect to distance along a thickness direction extending perpendicularly from said main plane such that the refractive index of said microlens at a center portion thereof along said thickness direction is lower than that at either end portion of said microlens along said thickness direction.

6. A semiconductor light emitting device according to claim 1, wherein said microlens has a first convex lens and a second concave lens located sequentially along path of light beam of the light emitting element.

7. A semiconductor light emitting device according to claim 6, wherein said microlens has a varying refractive index which varies with respect to distance along a thickness direction extending perpendicularly from said main plane such that the refractive index of said microlens at a center portion thereof along said thickness direction is higher than that at either end portion of said microlens along said thickness direction, and said second concave lens has a varying refractive index which varies with respect to distance along a thickness direction extending perpendicularly from said main plane such that the refractive index of said microlens at a center portion thereof along said thickness direction is smaller than that at either end portion of said microlens along said thickness direction.

8. A semiconductor light emitting device according to claim 1, wherein said microlens comprises a first convex lens and a second convex lens, said first convex lens having said first surface as an input plane and said second convex lens having input surface which is substantially parallel to said output plane of said semiconductor light emitting element, said first convex lens having a curved output surface, and said second convex lens having a curved output surface; and said first convex lens and said second convex lens each having a varying refractive index which varies with respect to distance along a thickness direction extending perpendicularly from said main plane such that the refractive index of said second convex lens is higher than that at either end portion of said microlens along said thickness direction.

9. A semiconductor light emitting system according to claim 1, wherein said semiconductor light emitting element is a semiconductor laser.

10. A semiconductor light emitting system according to claim 1, wherein said semiconductor light emitting element is a light emitting diode.

11. A semiconductor light emitting system according to claim 1, wherein length of said gap space is in the range between 0.4 μm and 1.5 μm.

12. A semiconductor light emitting system according to claim 1, wherein thickness of said second area of said semiconductor substrate is smaller than that of said first area of said semiconductor substrate, having a step at border of said first area and said second area.

13. A semiconductor light emitting system according to claim 1, wherein material of said microlens is one selected from $S_iO_2$, $S_i$—N—O, and polyimide resin.

14. An array of semiconductor light emitting systems, comprising:

a semiconductor substrate having a first area and a second area, said second area having a main plane;

a plurality of semiconductor light emitting elements, each said semiconductor light emitting element being disposed on said first area of said semiconductor substrate, each said semiconductor light emitting element having a laminated semiconductor body which includes an active layer, a pair of clad layers sandwiching said active layer, and an output plane perpendicular to said main plane of said laminated semiconductor body for emitting a light beam;

a plurality of microlenses, each said microlens being spaced from said laminated semiconductor body and being disposed on said second area of said semiconductor substrate for focusing said light beam output from said output plane of said laminated semiconductor body, each said microlens having a first surface which is substantially planar and which is substantially parallel to said output plane, said first surface of said microlens being spaced from said output plane of said laminated semiconductor body by a predetermined gap distance; each said microlens being composed of transparent material; and said microlenses having respective focal lengths which are different from one another;

each said microlens having a second surface for emitting said light beam supplied to said first surface from said output plane;

said first surface and said second surface of said microlens being substantially perpendicular to said main plane of said laminated semiconductor body; and a pair of electrode layers attached on said semiconductor substrate and each of said plurality of semiconductor light emitting elements, respectively, for energizing respective ones of said plurality of semiconductor light emitting elements.

15. A semiconductor light emitting system according to claim 1, wherein said semiconductor substrate is N-type semiconductor, first clad layer is N-type semiconductor, an active layer is I-type semiconductor, and second clad layer is P-type semiconductor.

* * * * *